(12) United States Patent
Jang

(10) Patent No.: US 7,397,076 B2
(45) Date of Patent: Jul. 8, 2008

(54) CMOS IMAGE SENSOR WITH DARK CURRENT REDUCTION

(75) Inventor: Hoon Jang, Cheongju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 91 days.

(21) Appl. No.: 10/971,590

(22) Filed: Oct. 22, 2004

(65) Prior Publication Data

US 2005/0087783 A1    Apr. 28, 2005

(30) Foreign Application Priority Data

Oct. 23, 2003   (KR) .............. 10-2003-0074445

(51) Int. Cl.
*H01L 31/062* (2006.01)
*H01L 31/113* (2006.01)
*H01L 31/06* (2006.01)

(52) U.S. Cl. ............ 257/292; 257/233; 257/290; 257/291; 257/293; 257/461

(58) Field of Classification Search ............ None
See application file for complete search history.

(56) References Cited

U.S. PATENT DOCUMENTS

| | | | |
|---|---|---|---|
| 5,841,126 A | 11/1998 | Fossum et al. | |
| 5,844,264 A * | 12/1998 | Shinji | 257/223 |
| 5,886,659 A | 3/1999 | Pain et al. | |
| 5,990,506 A | 11/1999 | Fossum et al. | |
| 6,005,619 A | 12/1999 | Fossum | |
| 6,021,172 A | 2/2000 | Fossum et al. | |
| 6,177,293 B1 * | 1/2001 | Netzer et al. | 438/73 |
| 6,339,248 B1 * | 1/2002 | Zhao et al. | 257/461 |
| 6,392,263 B1 * | 5/2002 | Chen et al. | 257/292 |
| 6,423,993 B1 * | 7/2002 | Suzuki et al. | 257/292 |
| 6,512,280 B2 * | 1/2003 | Chen et al. | 257/465 |
| 6,531,725 B2 | 3/2003 | Lee et al. | |
| 6,545,302 B2 * | 4/2003 | Han | 257/222 |
| 6,690,423 B1 * | 2/2004 | Nakamura et al. | 348/311 |

(Continued)

FOREIGN PATENT DOCUMENTS

JP     2004319683    * 11/2004

OTHER PUBLICATIONS

Korean Prior Art Search, dated, Jul. 15, 2005. Grant of Patent by KIPO on Jul. 19, 2005.*

*Primary Examiner*—Andy Huynh
*Assistant Examiner*—Hoang-Quan Ho
(74) *Attorney, Agent, or Firm*—Andrew D. Fortney

(57) ABSTRACT

Disclosed are a CMOS image sensor and a fabrication method thereof, which is adequate to reduce dark current. The CMOS image sensor comprises a device isolation region and an active region, which are formed on a semiconductor substrate; a photocharge generating portion formed on the active region for absorbing light externally and generating and accumulating charges; a transistor portion including at least one transistor for processing the charges accumulated in the photocharge generating portion; and a control terminal for preventing dark current from being introduced into the photocharge generating portion, and ejecting the dark current after temporally storing the dark current. The control terminal is operated to store the dark current for an integration time when a photodiode as the photocharge generating portion receives light, and eject the stored dark current by being grounded when the reset transistor is turned on.

18 Claims, 5 Drawing Sheets

U.S. PATENT DOCUMENTS

| | | | |
|---|---|---|---|
| 6,713,796 B1* | 3/2004 | Fox | 257/292 |
| 6,744,084 B2* | 6/2004 | Fossum | 257/292 |
| 6,781,169 B2* | 8/2004 | Roy | 257/292 |
| 6,885,047 B2* | 4/2005 | Shinohara et al. | 257/292 |
| 6,888,214 B2* | 5/2005 | Mouli et al. | 257/510 |
| 7,015,521 B2* | 3/2006 | Koyama | 257/292 |
| 7,042,061 B2* | 5/2006 | Nakamura et al. | 257/461 |
| 7,205,627 B2* | 4/2007 | Adkisson et al. | 257/463 |
| 2001/0015435 A1* | 8/2001 | Suzuki et al. | 257/1 |
| 2004/0161868 A1* | 8/2004 | Hong | 438/48 |
| 2004/0222449 A1* | 11/2004 | Koyama | 257/292 |
| 2005/0006676 A1* | 1/2005 | Watanabe | 257/290 |
| 2005/0062085 A1* | 3/2005 | He et al. | 257/292 |
| 2005/0133825 A1* | 6/2005 | Rhodes et al. | 257/204 |

\* cited by examiner (RELATED ART)

US 7,397,076 B2

CMOS IMAGE SENSOR WITH DARK CURRENT REDUCTION

CLAIM OF PRIORITY

This application makes reference to, incorporates the same herein, and claims all benefits accruing under 35 U.S.C. §119 from an application for COMPLEMENTARY METAL OXIDE SEMICONDUCTOR IMAGE SENSOR AND METHOD FOR FABRICATING THEREOF filed in the Korean Industrial Property Office on Oct. 23, 2003 and there duly assigned Serial No. 10-2003-0074445.

BACKGROUND OF THE INVENTION (a) Field of the Invention

The present invention relates to a complementary metal oxide semiconductor (CMOS) image sensor, and more particularly to a CMOS image sensor and a fabrication method thereof, which is adequate to reduce dark current.

(b) Description of the Related Art

In general, image sensors include a charge coupled device (CCD) image sensor and a CMOS image sensor.

Of these sensors, the CCD image sensor comprises a photo-electric conversion and charge accumulation portion for absorbing light reflected by an external irradiated object into the sensor and collecting and accumulating photo-charges, a charge transport portion for transporting photo-charges generated in the photo-electric conversion and charge accumulation portion, and a signal conversion portion for converting the photocharges transported from the charge transport portion into an electrical signal.

The photo-electric conversion and charge accumulation portion mainly uses a photodiode which is a device for accumulating charges generated by light in a potential well formed by a PN junction. The charges generated in the photo-electric conversion and charge accumulation portion and confined in the potential well of the photodiode can be transported to a required location by moving the potenial well. In addition, the signal conversion portion generates a voltage from the transported charges. On the other hand, after the voltage is generated by the signal conversion portion, the charges confined in the current potential well are required to be ejected for next charges. For this end, a barrier of the current potential well in the signal conversion portion is removed to eject the charges, which is referred to as "reset".

In this way, the CCD image sensor detects signals not by means of switching by transistors in the CMOS image sensor, but charge coupling. In the CCD image sensor, since the photodiode corresponding to a pixel for detecting light extracts photocurrent after the photocurrent is accumulated for a certain time rather than extracting it instantly, there is an advantage in that a signal voltage is increased by an amount of accumulation of the photocurrent, which results in good photosensitivity and reduced noise. However, in the CCD image sensor, since the transport of photocharges is continuous, the driving method is complicated and a high voltage of about 8-10 V and high power of more than 1 W are consumed.

On the other hand, although the CMOS image sensor is inferior in electro-optic characteristics to the CCD image sensor, it is superior in low power consumption and high integration to the CCD image sensor.

Accordingly, improvement of the electro-optic characteristics, particularly a dark current characteristic acting as a factor to lower quality and reliability of the CMOS image sensor, is increasing as a subject of interest of the CMOS image sensor. The dark current characteristic is particularly affected by leakage current generated in a lateral wall of a shallow trench isolation (STI) film.

One example of the CMOS image sensor is disclosed in U.S. Pat. Nos. 6,531,725 and 6,545,302.

Hereinafter, the reason why the dark current characteristic is generated will be described in detail with reference to FIGS. 1 to 4.

FIGS. 1 and 2 show a layout of a conventional CMOS image sensor having a 3-transistor (TR) structure and an equivalent circuit diagram thereof, respectively.

A CMOS image sensor 100 comprises one photodiode PD and an aggregate of pixel units each having three transistors TR1, TR2 and TR3.

A P-type semiconductor substrate 102 has STI films 104 for device isolation formed thereon, a device region defined by the STI films 104 has a photodiode PD formed by photodiode N+ implants, and a depletion layer 106 is formed beneath the photodiode PD.

The three transistors TR1, TR2 and TR3 are respectively a reset transistor TR1, a select transistor TR2 and an access transistor TR3.

A reset signal is applied to a gate electrode of the reset transistor TR1 through a reset signal input terminal 108. The reset transistor TR1 has a drain electrode connected to a floating node 110 and a source electrode connected to a VDD terminal Vdd.

In addition, the select transistor TR2 has a gate electrode connected to the floating node 110 and a source electrode connected to the VDD terminal Vdd.

In addition, a row select signal is applied to a gate electrode of the access transistor TR3 through a row select signal input terminal 112. The access transistor TR3 has a source electrode connected to a drain electrode of the select transistor TR2 and a drain electrode connected to a column select line 114.

The photodiode PD is formed between the floating node 110 and a ground 116.

Now, operation of the CMOS image sensor as constructed above will be described.

When the reset transistor TR1 is turned on and a source node potential of the reset transistor TR1 becomes VDD, initialization is completed. At this time, a reference value is sensed.

Also, when electron-hole pairs, i.e., signal charges, are generated in the depletion layer 106 of the photodiode PD by externally incident light, potential of the floating node 110, which is the source electrode of the reset transistor TR1, or potential of the gate electrode of the select transistor TR2 is changed in proportion to the amount of the generated signal charges, and accordingly, potential of the gate electrode of the select transistor TR2 is changed and hence a bias of the source electrode of the select transistor TR2 and the drain electrode of the access transistor TR3 is changed.

In this way, while the signal charges are accumulated, the potentials of the source electrode of the reset transistor TR1 and the source electrode of the select transistor TR2 are changed. At this time, when the row select signal is applied to the gate electrode of the access transistor TR3 through the row select signal input terminal 112, a potential difference due to the signal charges generated in the photodiode PD is outputted to the column select line 114.

As described above, after a signal level is detected by the signal charges generated in the photodiode PD, while the reset transistor TR1 is turned on by the reset signal through the reset signal input terminal 108, all signal charges accumulated in the photodiode PD are reset.

However, with the CMOS image sensor as constructed above, since the photodiode is surrounded by the STI films as shown in FIGS. 3 and 4, current induced on an unstable silicon surface of a lateral wall of the STI film 104 in addition to current by electrons generated by light flows through the photodiode PD along a direction shown as an arrow in FIG. 4.

Accordingly, even in a state where there is no light, there is a problem in that a signal may be erroneously detected in the photodiode PD as if there is light. A current inducing such an error is referred to as "dark current". This dark current may be even more greatly generated in an image sensor having a structure where devices are isolated from each other by etching a silicon wafer.

SUMMARY OF THE INVENTION

In considerations of the above problem, it is an aspect of the present invention to provide a CMOS image sensor, that is adequate to reduce dark current.

It is another aspect of the present invention to provide a method of fabricating the CMOS image sensor.

To achieve the aspect, there is provided a CMOS image sensor comprising:

a device isolation region and an active region, which are formed on a semiconductor substrate;

a photocharge generating portion formed on the active region for absorbing light externally and generating and accumulating charges;

a transistor portion including at least one transistor for processing the charges accumulated in the photocharge generating portion; and a control terminal for preventing dark current from being introduced into the photocharge generating portion, and ejecting the dark current after temporally storing the dark current.

Preferably, the CMOS image sensor further comprises a separating portion for separating the photocharge generating portion from the control terminal. Preferably, the transistor portion includes a reset transistor, a select transistor and an access transistor, the control terminal is operated to store the dark current for an integration time when a photodiode as the photocharge generating portion receives light, and eject the stored dark current by being grounded when the reset transistor is turned on.

To achieve another aspect, there is provided a method of fabricating a CMOS image sensor, comprising:

forming a device isolation region by etching a semiconductor substrate of a first conductivity type;

forming a transistor portion including at least one transistor on the semiconductor substrate on which the device isolation region is formed;

forming a photocharge generating portion by injecting impurities of a second conductivity type opposite to the first conductivity type into an active region between the device isolation region and the transistor portion on the semiconductor substrate;

forming a control terminal by injecting impurities of the second conductivity type into a boundary between the photocharge generating portion and the device isolation region in a halo junction form; and forming a separating portion by injecting impurities of the first conductivity type between the photocharge generating portion and the control terminal.

Preferably, the device isolation region is formed by a shallow trench isolation (STI) film and the photocharge generating portion is formed by a photodiode.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A CMOS image sensor and a fabrication method thereof according to a preferred embodiment of the present invention will now be described in detail with reference to the accompanying drawings.

Figure 1:
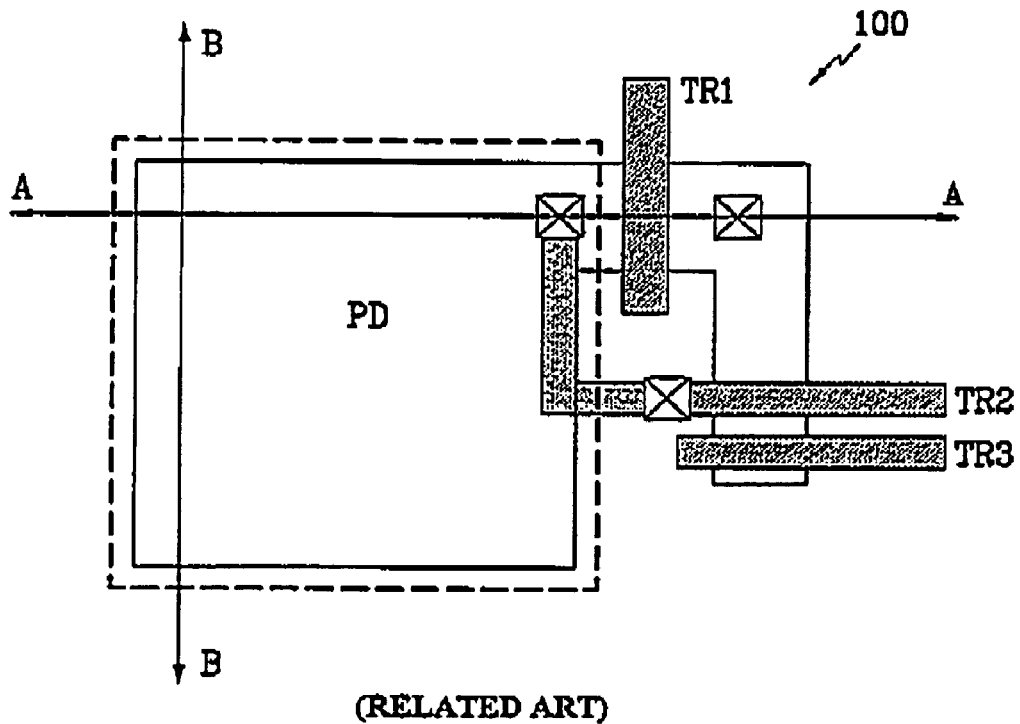
FIG. 1 is a layout of a conventional CMOS image sensor having a 3-TR structure.
Figure 2:
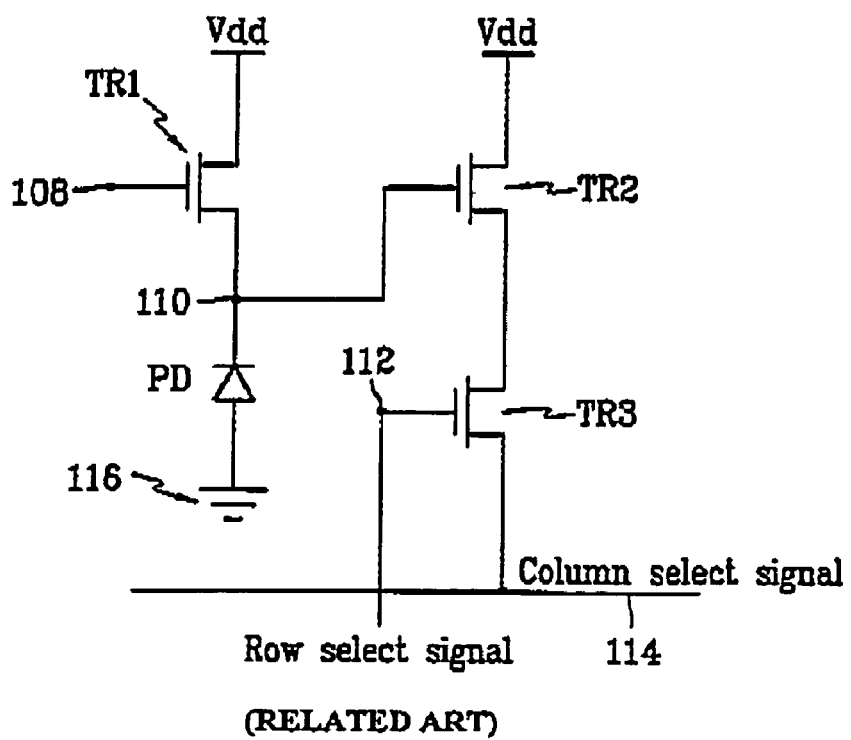
FIG. 2 is an equivalent circuit diagram of FIG. 1.
Figure 3:
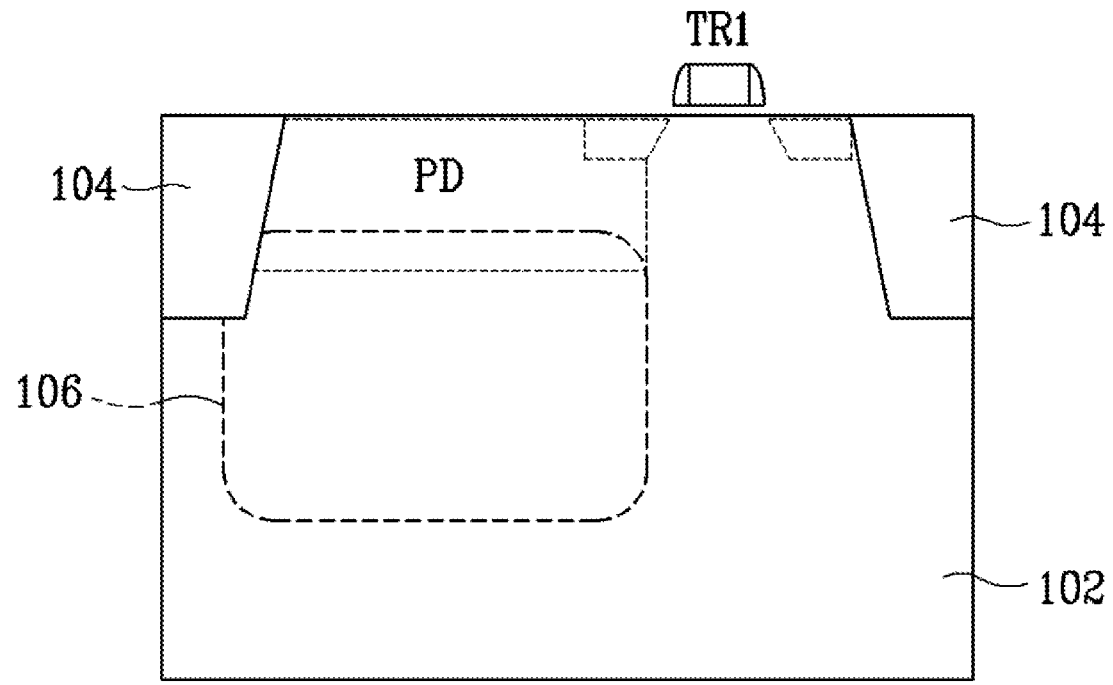
FIG. 3 is a sectional view taken along a line "A-A" in FIG. 1.
Figure 4:
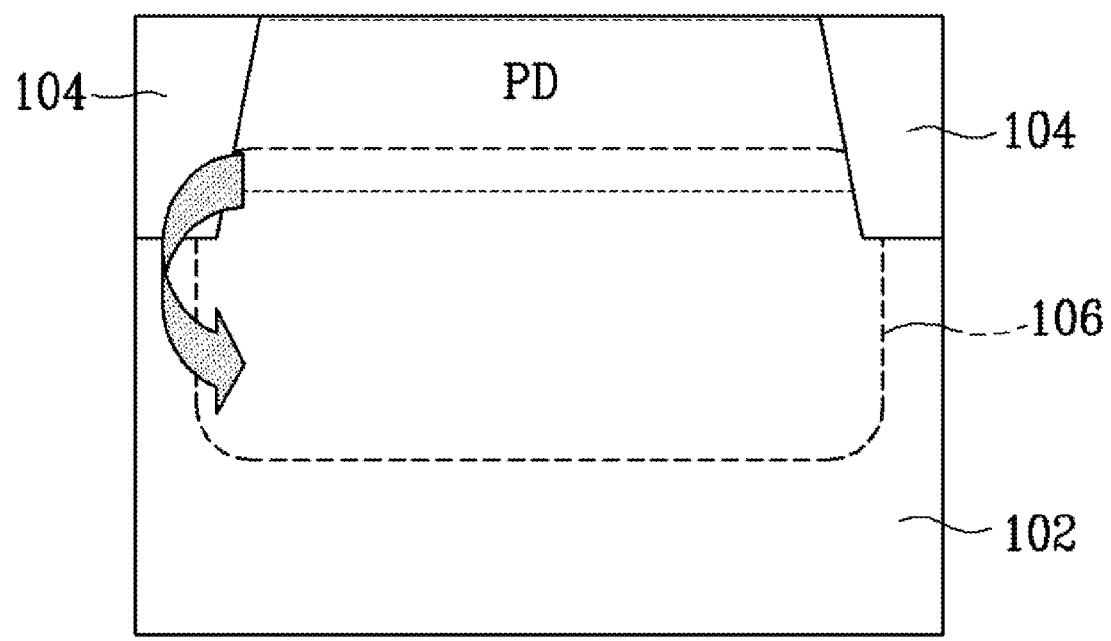
FIG. 4 is a sectional view taken along a line "B-B" in FIG. 1.
Figure 5:
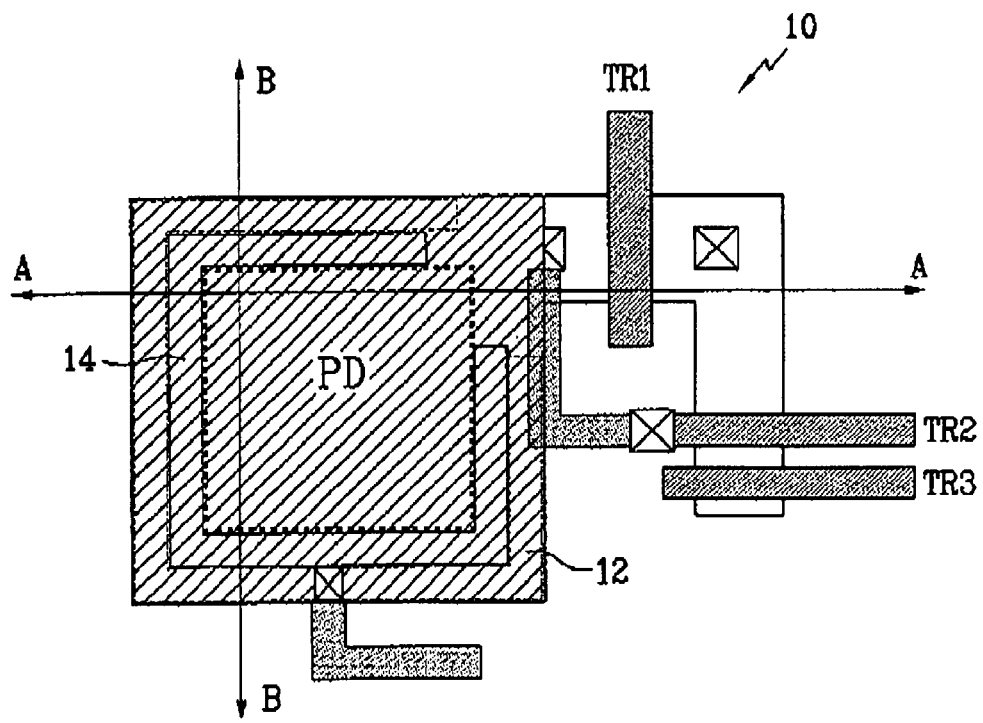
FIG. 5 is a layout of a CMOS image sensor having a 3-TR structure according to an embodiment of the present invention.
Figure 6:
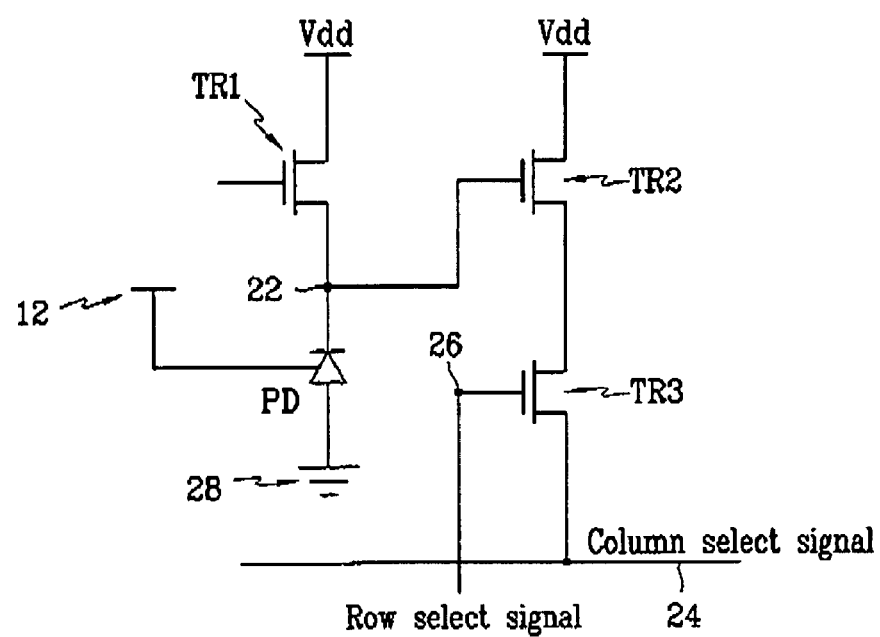
FIG. 6 is an equivalent circuit diagram of FIG. 5.
Figure 7:
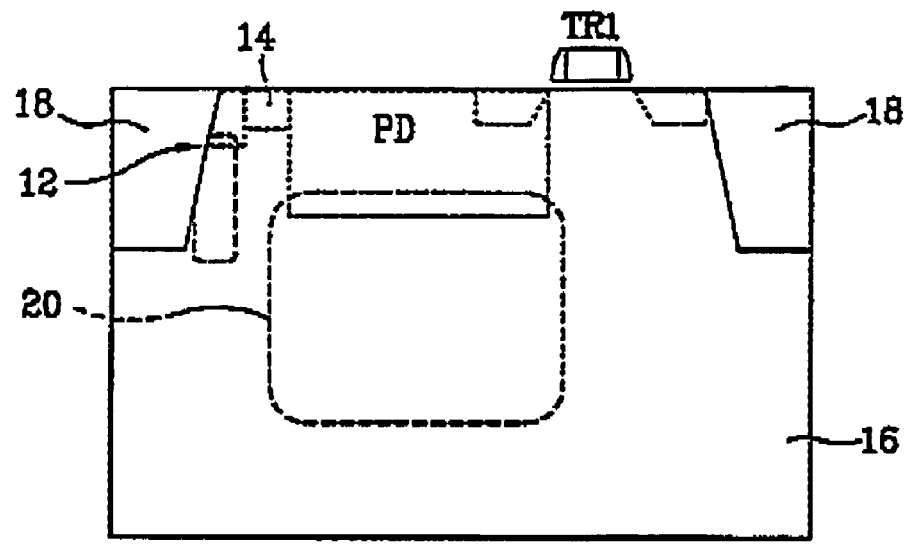
FIG. 7 is a sectional view taken along a line "A-A" in FIG. 5.
Figure 8:
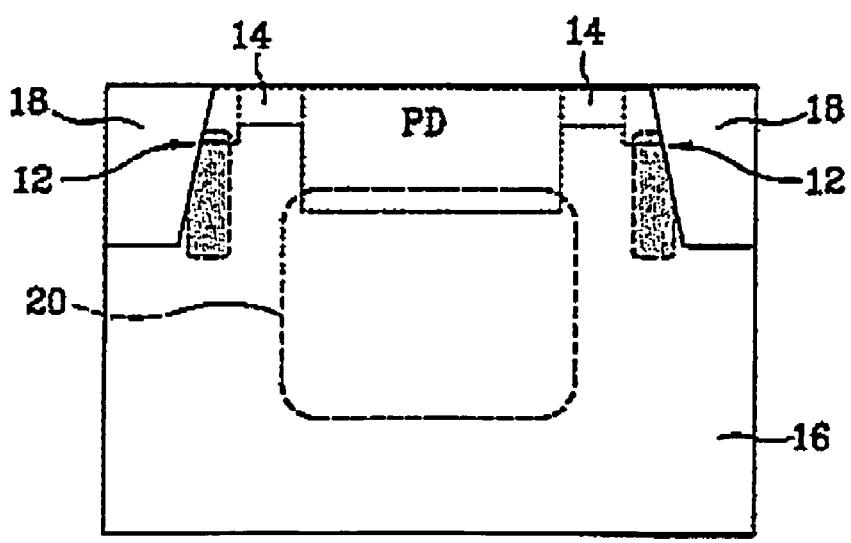
FIG. 8 is a sectional view taken along a line "B-B" in FIG. 5.

FIGS. 5 and 6 are a layout of a CMOS image sensor having a 3-TR structure according to an embodiment of the present invention and an equivalent circuit diagram thereof, respectively. FIGS. 7 and 8 are sectional views taken along lines "A-A" and "B-B" in FIG. 5, respectively.

A CMOS image sensor 10 of the embodiment of the present invention generally comprises one photodiode PD, a control terminal 12 for preventing dark current from being introduced into the photodiode PD, a separating film 14 for separating the photodiode PD from the control terminal 12, and an aggregate of pixel units each having three transistors TR1, TR2 and TR3.

A P-type semiconductor substrate 16 has STI films 18 for device isolation formed thereon, a device region defined between the STI films 18 has the photodiode PD formed by photodiode N+ implants, and a depletion layer 20 is formed beneath the photodiode PD.

In addition, the control terminal 12 joined to a semiconductor substrate 16 in a halo junction form by N+ implants is formed at a boundary between the STI film 18 and the photodiode PD, and the separating film 14 is formed by P+ implants between the control terminal 12 and the photodiode PD.

The three transistors TR1, TR2 and TR3 are respectively a reset transistor TR1, a select transistor TR2 and an access transistor TR3.

The reset transistor TR1 has a drain electrode connected to a floating node 22 and a source electrode connected to a VDD terminal Vdd.

In addition, the select transistor TR2 has a gate electrode connected to the floating node 22 and a source electrode connected to the VDD terminal Vdd.

A row select signal is applied, through a row select signal input terminal 26, to a gate electrode of the access transistor TR3 connected in series to the select transistor TR2. The access transistor TR3 has a drain electrode connected to a column select line 24.

The photodiode PD is formed between the floating node 22 and a ground 28, and the control terminal 12 is connected to the photodiode PD.

Now, a fabrication method of the CMOS image sensor as constructed above will be described with reference to FIG. 9.

Figure 9:
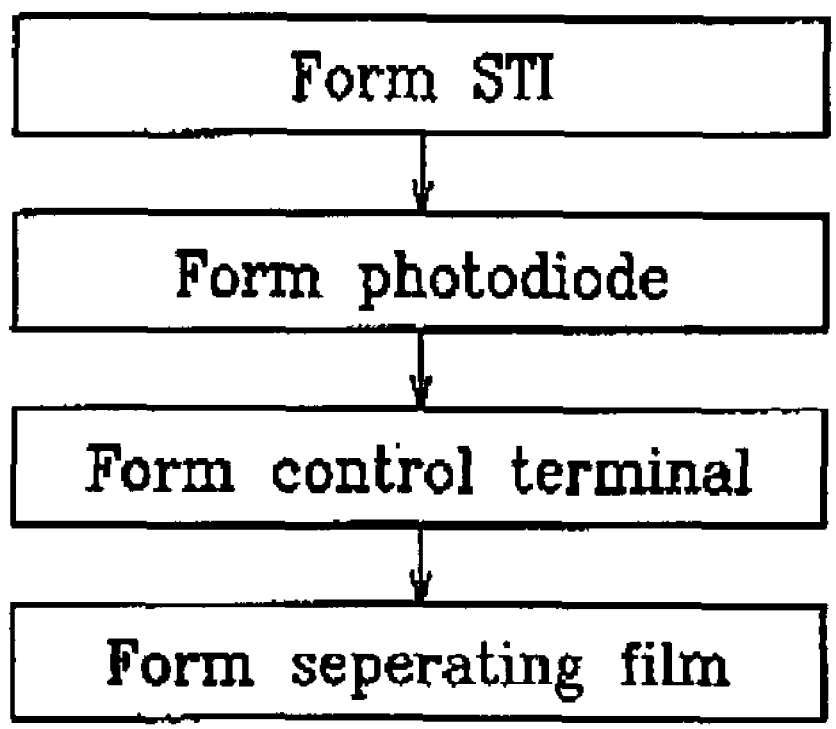
FIG. 9 is a flow chart illustrating a fabrication method of the CMOS image sensor having the 3-TR structure according to the embodiment of the present invention.

Referring to FIG. 9, the STI film 18 is formed by etching the semiconductor substrate 16 of a first conductivity type, for example, a P-type. Next, the photodiode PD is formed as the photocharge portion by injecting impurities of a second conductivity type, for example N+ implants, opposite to the first conductivity type into the device region of the semiconductor substrate 16. Next, the control terminal 12 of the halo junction form is formed by injecting impurities of the second conductivity type, for example N+ implants, into the boundary between the photodiode PD and the STI films 18. Finally, the separating film 18 is formed by injecting impurities of the first conductivity type, for example, P+ implants, between the photodiode PD and the control terminal 12.

With the CMOS image sensor fabricated as above, the control terminal accumulates the dark current generated on unstable silicon surfaces of lateral walls of the STI films 18 for an integration time when the CMOS image sensor receives light, and the dark current can be removed by grounding the control terminal 12 when the reset transistor TR1 is turned on.

In addition, a voltage of the control terminal 12 can be varied to optimize the depth of the potential well according to a characteristic of the photodiode PD.

As is apparent from the above description, according to the present invention, by forming the control terminal around the photodiode, the dark current generated in the STI films can be actively removed, which results in improvement of the dark current characteristic. In addition, even in the case where excess electrons are generated by very bright light, the excess electrons can be ejected through the control terminal.

Accordingly, a characteristic of the CMOS image sensor of the present invention can be optimized.

Although the CMOS image sensor having the 3-TR structure has been exemplified, the present invention is applicable to any CMOS image sensors having more than one transistor.

Although the preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A CMOS image sensor comprising:
   a device isolation region and an active region in a semiconductor substrate;
   a photocharge generating portion in the active region for absorbing external light and generating and accumulating charges;
   a separating film between the device isolation region and the photocharge generating portion;
   a transistor portion including at least one transistor for processing the charges accumulated in the photocharge generating portion; and
   a control terminal in the active region having a maximum depth greater than that of the photocharge generating portion, at a boundary with the device isolation region and having the same conductive type as the photocharge generating portion for preventing dark current from being introduced from the device isolation region into the photocharge generating portion, and ejecting the dark current after temporally storing the dark current.

2. The CMOS image sensor of claim 1, wherein the transistor portion includes a reset transistor, a select transistor and an access transistor.

3. The CMOS image sensor of claim 2, wherein the control terminal stores the dark current for an integration time when light is received, and ejects the stored dark current by being grounded when the reset transistor is turned on.

4. The CMOS image sensor of claim 1, wherein the separating film separates the photocharge generating portion from the control terminal.

5. The CMOS image sensor of claim 1, wherein the photocharge generating portion comprises a photodiode.

6. The CMOS image sensor of claim 1, wherein the semiconductor substrate comprises a P-type semiconductor substrate.

7. The CMOS image sensor of claim 1, wherein the photocharge generating portion comprises an N+ implant.

8. The CMOS image sensor of claim 1, wherein the control terminal comprises an N+ implant.

9. The CMOS image sensor of claim 1, wherein the control terminal comprises a halo junction.

10. The CMOS image sensor of claim 1, wherein the control terminal has a voltage of about zero when the reset transistor is on.

11. The CMOS image sensor of claim 1, wherein the control terminal has a voltage corresponding to a depth of a potential well according to a characteristic of the photocharge generating portion.

12. The CMOS image sensor of claim 1, wherein the control terminal has a depth greater than the separating film.

13. The CMOS image sensor of claim 1, wherein the photocharge generating portion has a depth greater than the separating film.

14. The CMOS image sensor of claim 1, wherein the photocharge generating portion comprises impurities of a second conductivity type, and the separating film comprises impurities of a first conductivity type.

15. The CMOS image sensor of claim 1, wherein the control terminal comprises impurities of a second conductivity type, and the separating film comprises impurities of a first conductivity type.

16. The CMOS image sensor of claim 15, wherein the photocharge generating portion comprises impurities of a second conductivity type.

17. The CMOS image sensor of claim 15, wherein the semiconductor substrate comprises impurities of a first conductivity type.

18. The CMOS image sensor of claim 15, wherein the control terminal comprises an N implant, and the separating film comprises a P+ implant.

* * * * *